United States Patent
Murakami et al.

(10) Patent No.: US 7,244,913 B2
(45) Date of Patent: Jul. 17, 2007

(54) TEMPERATURE REGULATOR FOR MICROCHEMICAL CHIP

(75) Inventors: Atsushi Murakami, Tokyo (JP); Shigeru Watanabe, Iruma (JP)

(73) Assignee: Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 10/884,982

(22) Filed: Jul. 7, 2004

(65) Prior Publication Data

US 2005/0006372 A1    Jan. 13, 2005

(30) Foreign Application Priority Data

Jul. 10, 2003  (JP)  ............................. 2003-194685
May 19, 2004  (JP)  ............................. 2004-148983

(51) Int. Cl.
- B01J 19/00  (2006.01)
- C12M 1/00  (2006.01)
- C12M 1/34  (2006.01)
- C12M 1/38  (2006.01)
- F25B 21/02  (2006.01)

(52) U.S. Cl. ..................... 219/385; 219/428; 219/521; 219/530; 219/537; 219/540; 435/288.4; 435/305.2; 62/3.3; 62/3.7

(58) Field of Classification Search ..................... None
See application file for complete search history.

(56) References Cited

U.S. PATENT DOCUMENTS

| | | | |
|---|---|---|---|
| 5,584,183 A * | 12/1996 | Wright et al. .................. 62/3.7 |
| 5,802,856 A * | 9/1998 | Schaper et al. ................ 62/3.7 |
| 6,432,695 B1 * | 8/2002 | Zou et al. ................. 435/287.2 |
| 6,489,551 B2 * | 12/2002 | Chu et al. ...................... 62/3.3 |
| 6,509,186 B1 * | 1/2003 | Zou et al. ................. 435/286.1 |
| 6,523,362 B2 * | 2/2003 | Binz et al. .................. 62/259.2 |
| 6,525,343 B1 | 2/2003 | Tanga |
| 6,706,519 B1 * | 3/2004 | Kellogg et al. ........... 435/288.5 |
| 6,720,187 B2 * | 4/2004 | Bedingham et al. ........... 436/45 |
| 6,727,479 B2 * | 4/2004 | Villa et al. ................... 219/521 |
| 6,759,013 B2 * | 7/2004 | Kaltenbach et al. ........ 422/101 |
| 6,787,314 B2 * | 9/2004 | Yasuda et al. ............ 435/288.4 |
| 6,833,536 B2 * | 12/2004 | Shigeura ...................... 219/553 |
| 6,875,619 B2 * | 4/2005 | Blackburn ................ 435/287.2 |
| 6,893,824 B2 * | 5/2005 | Ito ........................... 435/283.1 |
| 2003/0008286 A1* | 1/2003 | Zou et al. ....................... 435/6 |
| 2005/0009070 A1* | 1/2005 | Arciniegas et al. ............. 435/6 |
| 2005/0019902 A1* | 1/2005 | Mathies et al. ........... 435/287.2 |
| 2005/0112754 A1* | 5/2005 | Yoon et al. ............... 435/287.2 |

FOREIGN PATENT DOCUMENTS

| JP | 2002306154 A | * | 10/2002 |
|---|---|---|---|
| JP | 2003172736 A | * | 6/2003 |
| WO | WO 00/48724 A1 | | 8/2000 |

* cited by examiner

*Primary Examiner*—Joseph M. Pelham
(74) *Attorney, Agent, or Firm*—Sughrue Mion, PLLC

(57) ABSTRACT

A temperature regulator regulates a temperature of a microchemical chip that has chemical reaction sections. The temperature regulator includes a temperature measuring unit and a thermoelectric element corresponding to each chemical reaction section. The temperature regulator further includes a heat conductor, a heat exchanging unit, and a temperature controlling unit that controls electric current to be applied to the thermoelectric element based on a temperature measured by the temperature measuring unit.

21 Claims, 10 Drawing Sheets

TEMPERATURE REGULATOR FOR MICROCHEMICAL CHIP

BACKGROUND OF THE INVENTION

1) Field of the Invention

The present invention relates to a technology that makes it possible to regulate a temperature of a localized portion of a microchemical chip.

2) Description of the Related Art

A thermoelectric element includes a plurality of thermocouples that transfer thermal energy into electric energy, and vice versa. A thermocouple is formed with a p-type and an n-type thermoelectric semiconductors of substantially the same lengths, and the p-type and the n-type thermoelectric semiconductors are connected with each other end to end.

In a typical thermoelectric element, more than one thermocouples are arranged in such a manner that the p-type and the n-type thermoelectric semiconductors alternate and the thermocouples are electrically connected to each other in series. The thermoelectric element generates voltage due to Seebeck effect when a temperature difference occurs between its two ends. On the other hand, absorption of heat occurs at one end and radiation of heat occurs at other end of the thermoelectric element due to Peltier effect when a direct current is applied to it. In other words, the thermoelectric element shows a reversible effect.

Because the thermoelectric elements show the reversible effect, they are advantageously used in thermoelectric transducers. Precisely, since surface temperatures of the ends of the thermoelectric element can be precisely controlled by controlling an amount and a direction of an electric current flowing through it, it can be advantageously used as a temperature regulator.

A microchemical chip is a chip used for performing a chemical process and studying the process. The chemical reaction is performed at a portion, i.e. a chemical reaction section, of the microchemical chip. The chemical reaction section can be on the surface or it can be inside the microchemical chip. Several kinds of microchemical chips are known. Chips for DNA analysis (DNA chips), chips for protein analysis, micro TASs (Total Analysis System), Lab-on-a-chips, and microreactor chips are just a few example of the microchemical chips.

Various kinds of chemical processes can be carried out in chemical reaction sections. Mixing, reaction, extraction, separation, and condensation are few examples of such chemical processes. It is necessary to set a temperature at an optimal condition for each of the processes, for example, to speed up a reaction, to stabilize or activate a system in the reaction, or to enhance efficiency of the reaction.

If there are more than one chemical reaction sections in a microchemical chip, it becomes necessary to take measures to avoid transmission of heat from one chemical reaction section to other chemical reaction sections to keep the optimal temperature for each chemical reaction section. Therefore, a structure that enables to locally control the temperature at each of the chemical reaction section is required. A microchemical chip that has such a structure, i.e., a structure that enables local temperature adjustment, has been disclosed in International Publication No. 0048724.

FIG. 17 is a schematic of a microchemical chip that is disclosed in the above patent literature. A thermoelectric element 103 is arranged right under a chemical reaction section 102 in a microchemical chip 101. It is possible to speed up the reaction in the chemical reaction section 102 by heating or cooling the chemical reaction section 102, or by adjusting a temperature at the chemical reaction section 102 with the thermoelectric element 103.

However, in the conventional technology disclosed in the above patent literature, the thermoelectric element 103 is not connected to a heat exchangeable object such as a heat sink. This causes a problem in which heat tends to accumulate in the thermoelectric element 103 when the temperature at the chemical reaction section 102 is adjusted by heating or cooling with the thermoelectric element 102 connected to the microchemical chip 101. In addition, in the above patent literature, none of a specific structure for connecting the microchemical chip 101 and the thermoelectric element 103 is disclosed. Therefore, it is difficult to connect the microchemical chip 101 and the thermoelectric element 103 while keeping sufficient heat conductivity. This causes inefficiency in the temperature adjustment at the chemical reaction section 102. Furthermore, none of a specific structure of a control apparatus to control the temperature is disclosed. Therefore, it is impossible to actually carry out the temperature adjustment by heating or cooling.

SUMMARY OF THE INVENTION

It is an object of the present invention to solve at least the problems in the conventional technology.

A temperature regulator according to an aspect of the present invention includes a microchemical chip; a chemical reaction section that is embedded in the microchemical chip, wherein a chemical process is carried out in the chemical reaction section; a temperature measuring unit that measures temperature of a portion of the microchemical chip around the chemical reaction section; a thermoelectric element that is heat-conductively connected to an outer surface of the microchemical chip near the chemical reaction section and that is driven in accordance with an electric current so as to perform any one of heating and cooling of the portion of the microchemical chip around the chemical reaction section; a heat exchanging unit that is heat-conductively connected to the thermoelectric element; and a temperature controlling unit that controls an electric current applied to the thermoelectric element based on the temperature measured by the temperature measuring unit.

A temperature regulator according to another aspect of the present invention includes a microchemical chip; a chemical reaction section that is embedded in the microchemical chip and where a predetermined chemical process is carried out; a temperature measuring unit that measures temperature of a portion of the microchemical chip around the chemical reaction section; a heat conductor that is heat-conductively connected to an outer surface of the microchemical chip on near the chemical reaction section; a thermoelectric element of which a surface is heat-conductively connected to the heat conductor, and that is driven in accordance with an electric current so as to perform any one of heating and cooling of the portion of the microchemical chip around the chemical reaction section; a heat exchanging unit that is heat-conductively connected to another surface of the thermoelectric element; and a temperature controlling unit that controls electric current applied to the thermoelectric element based on the temperature measured by the temperature measuring unit.

The other objects, features, and advantages of the present invention are specifically set forth in or will become apparent from the following detailed description of the invention when read in conjunction with the accompanying drawings.

DETAILED DESCRIPTION

Figure 1:
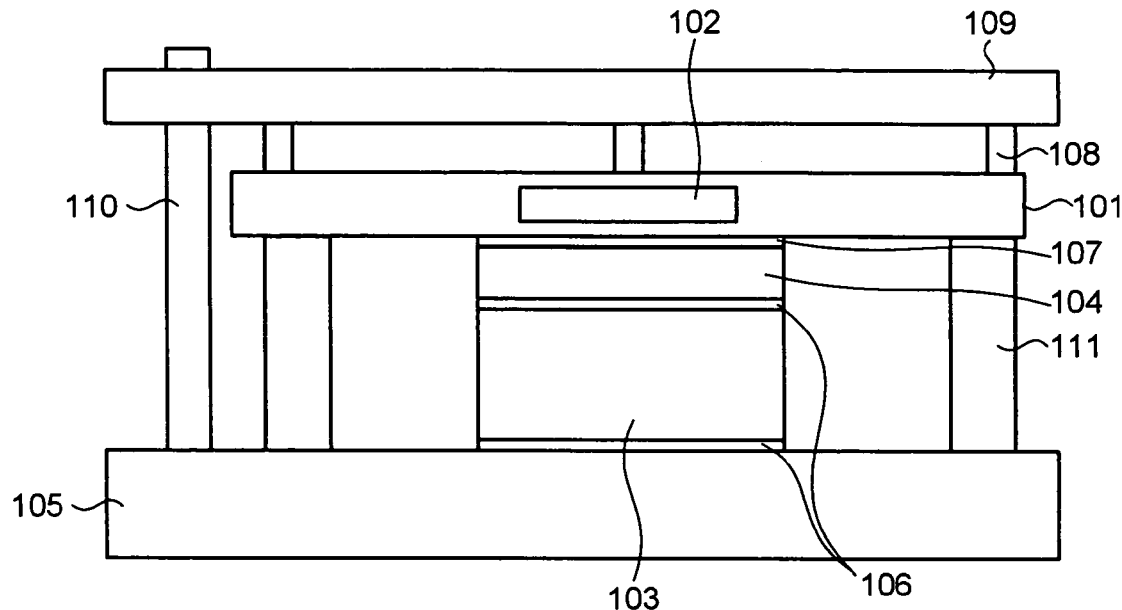
FIG. 1 is a side view of a temperature regulator according to a first embodiment of the present invention.

Exemplary embodiments of a temperature regulator according to the present invention are explained in detail with reference to accompanying drawings. Like reference characters are given to like components throughout the drawings.

FIG. 1 is a side view of a temperature regulator according to a first embodiment of the present invention. As shown in FIG. 1, the temperature regulator includes a microchemical chip 101, a thermoelectric element 103, a heat conductor 104, a heat exchanging unit 105, an elastic body 108, a movable member 109, a support 110, and a supporting member 111.

The microchemical chip 101 is formed with a material such as glass, resin, silicon, ceramics, a semiconductor, or metal. The microchemical chip 101 includes at least one of a chemical reaction section 102. The chemical reaction section 102 is prepared inside or on a surface of the microchemical chip 101 by micromachining such as machining, chemical etching, or lithography.

Drug solution is injected into the microchemical chip 101 from the outside. Various chemical processes, such as storing, transportation, mixing, reaction, extraction, separation, condensation, and collection, are proceeded in the chemical reaction section 102. There is an optimal temperature for each of the chemical processes, for example, to stably store, to mix speedily, to activate or speed up a reaction, to enhance efficiency of a reaction, or to stop a reaction to stabilize.

The heat conductor 104 is formed with a high heat conductive material, such as copper, aluminum, and aluminum nitride, or with material made to have high heat conductivity such as a heat pipe, and a material with anisotropic thermal conductivity. The heat conductor 104 is heat-conductively connected to the microchemical chip 101 through a heat-conductive connecting layer 107. The heat conductor 104 is connected near the chemical reaction section 102. In an example shown in FIG. 1, the heat conductor 104 is connected to the surface right under the chemical reaction section 102 through the heat-conductive connecting layer 107.

The heat-conductive connecting layer 107 is formed with a mixture of grease and filler. By mixing the filler with the grease, heat conductivity of the grease can be enhanced. The filler is, for example, grains of metal or ceramics, and the grease is, for example, silicon grease. The metal is, for example, copper or aluminum, and the ceramics is, for example, aluminum nitride, alumina, or boron nitride. The heat-conductive connecting layer 107 may also be formed with a heat conductive sheet such as a silicon resin to which the above filler is mixed, and that is elastic in the direction of the thickness.

The heat conductor 104 is heat-conductively connected on the other side to the thermoelectric element 103 through a connecting layer 106 that is formed with solder or a heat conductive adhesive. Thus, the heat conductor 104 is fixed to the thermoelectric element 103. The heat exchanging unit 105 is fixed to the thermoelectric element 103 on the other side through the connecting layer 106, which is formed with solder or a heat conductive adhesive.

In the heat conductive connection that is realized with a heat conductive grease, or a heat conductive sheet, or with solder or a heat conductive adhesive, thermal resistance between the surfaces that are connected to each other is extremely low. It is preferable that the thermal resistance is $1 \times 10^{-4}$ m$^2$°C./W or lower. The arrangement of the connecting section 106 and the heat-conductive connecting layer 107 is important to realize the heat conductive connection between the thermoelectric element 103, the heat conductor 104, the heat exchanging unit 105, and the microchemical chip 101. In other words, the connecting structure in terms of the thermal conductivity is important to locally control the temperature at the chemical reaction section 102 in the microchemical chip 101.

The support 110 is fixed to the heat exchanging unit 105. The support 110 stands perpendicularly to the heat exchanging unit 105, and stretches toward the side at which the microchemical chip 101 is arranged. The movable member 109 is slidably connected to the support 110. The movable member 109 can be fixed to the support 110 at a desirable position. The elastic body 108 is formed with an elastic deformable material such as a spring. The elastic body 108 is fixed to the movable member 109 on a side that faces to the microchemical chip 101.

When the movable member 109 is fixed at an appropriate position, pressure is applied to the microchemical chip 101 toward the direction of the thermoelectric element 103 and the heat conductor 104. The support 110, the movable member 109, and the elastic body 108 function as a pressure applying unit for the microchemical chip 101, and apply pressure to the heat-conductive connecting layer 107.

The supporting member 111 is fixed to the heat exchanging unit 105. The supporting member 111 supports the microchemical chip 101 from an opposite side from the side at which the movable member 109 is arranged. This enables the pressure applying unit described above to function properly to apply a proper amount of pressure to the microchemical chip 101. The supporting member 111 prevents deformation or damage of the microchemical chip 101 due to strong stress that is caused if an excessive pressure is applied to the microchemical chip 101.

As described above, the microchemical chip 101 and the heat conductor 104 are brought into an intimate contact with each other by applying the pressure with the pressure applying unit to the heat-conductive connecting layer 107 through which the microchemical chip 101 and the heat conductor 104 are heat-conductively connected. Thus, the extremely low thermal resistance can be maintained between the microchemical chip 101 and the heat conductor 104. Moreover, the same effect can be obtained, for example, by fixing the microchemical chip 101 to the heat exchanging unit 105 with screws instead of applying the pressure to the heat-conductive connecting layer 107.

Furthermore, the same effect can be obtained by applying a removable heat conductive material, such as a heat conductive grease and a heat conductive sheet, between the thermoelectric element 103 and the heat conductor 104 as the connecting layer 106, and then by fastening with screws to connect the thermoelectric element 103 and the heat conductor 104 to form an intimate contact.

A temperature measuring unit 402 (see FIG. 5) that measures the temperature at the chemical reaction section 102 is arranged near the chemical reaction section 102, for example, inside the heat conductor 104. The heat conductor 104 is arranged between the thermoelectric element 103 and the microchemical chip 101. Since the heat conductor 104 is highly heat conductive, the heat conductor 104 functions to lessen a distribution of the temperature of the microchemical chip 101 at a part at which the thermoelectric element 103 is connected. In other words, the heat conductor 104 has a function of maintaining the temperature at the chemical reaction section 102 uniformly without the distribution. Therefore, the temperature measuring unit 402 measures the temperature that is uniform at the chemical reaction section 102. The temperature measuring unit 402 is explained later.

Figure 6:
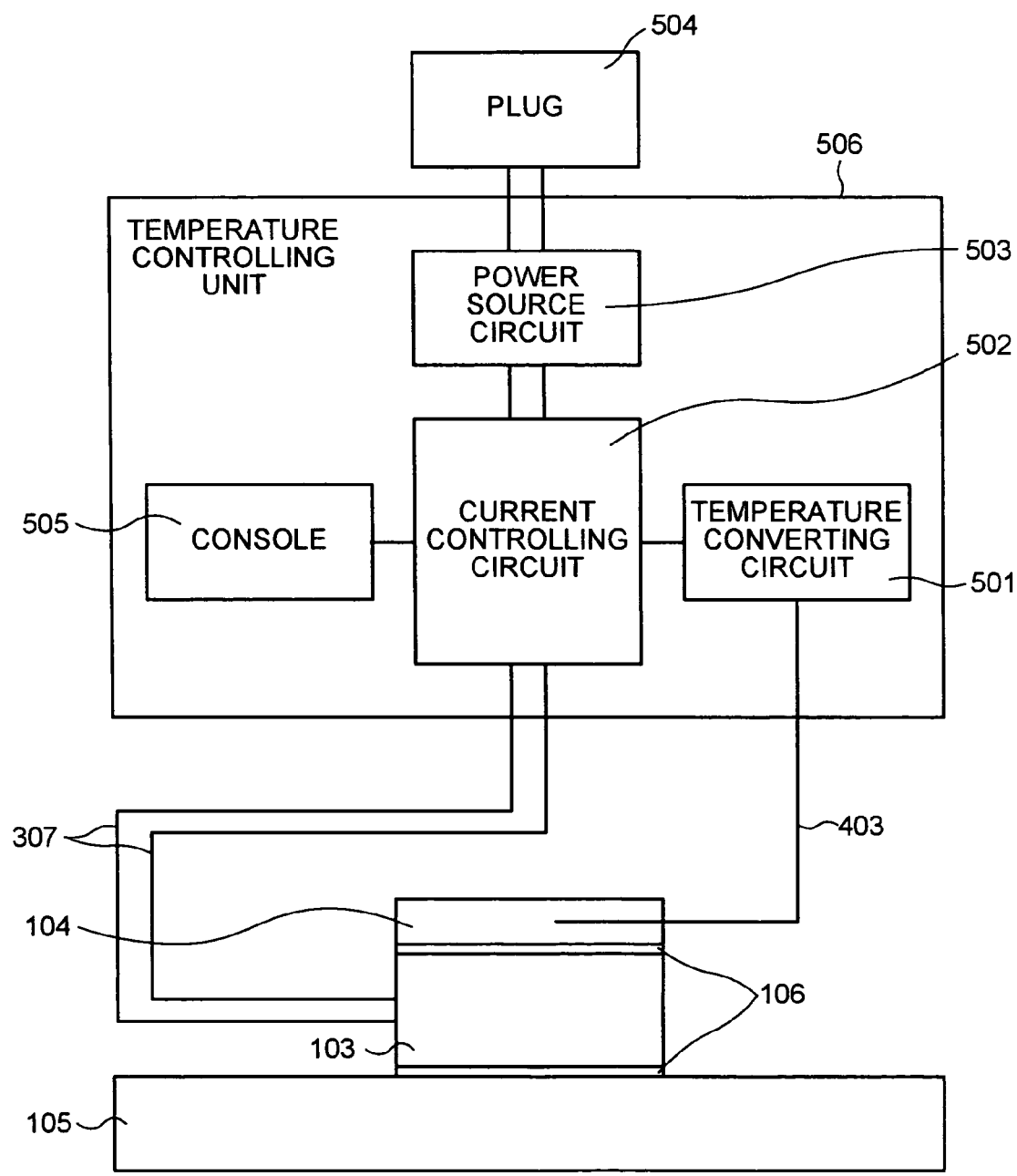
FIG. 6 is a block diagram of a temperature controlling unit.

A signal based on the temperature measured by the temperature measuring unit 402 is transmitted to a temperature controlling unit 506 (see FIG. 6). The temperature controlling unit 506 controls electric current to be applied to the thermoelectric element 103 with a PID (Proportional Integral Differential) control based on the signal to adjust the temperature to a target temperature. A configuration of the temperature controlling unit 506 is explained later.

With the structure described above, the thermal resistance between the thermoelectric element 103 and the chemical reaction section 102 is kept low. Therefore, heat loss also becomes low, and it becomes possible to precisely adjust the temperature at the chemical reaction section 102.

Moreover, if a heat conductive grease or a heat conductive sheet is used as the heat-conductive connecting layer 107, the microchemical chip 101 becomes removable from the heat conductor 104. Therefore, more than one of the microchemical chip 101 can be used in various ways with improved versatility. A thickness of the heat-conductive connecting layer 107 should be as thin as possible because the thinner the heat-conductive connecting layer 107 is, the lower the thermal resistance becomes.

Figure 2:
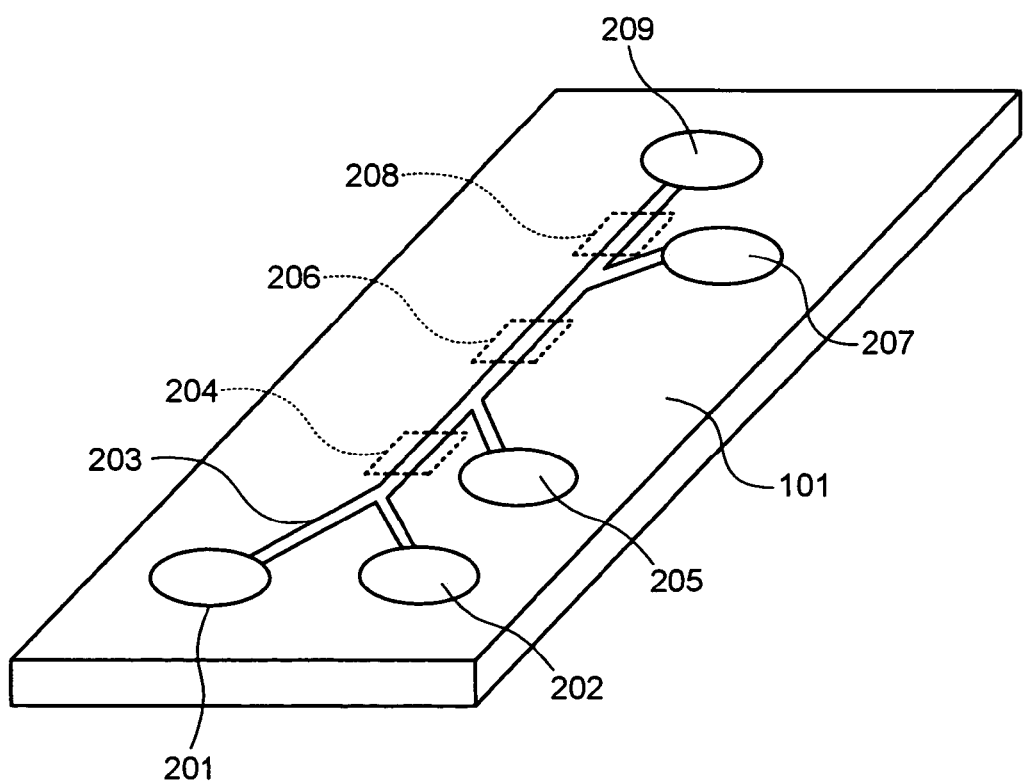
FIG. 2 is a perspective view of an example of a microchemical chip.

FIG. 2 is a perspective view of a microchemical chip used in the present invention. A case of a test with a sample such as blood to examine whether a disease exists is explained as a conceptual example.

The microchemical chip 101 shown in FIG. 2 includes a sample section 201, a solvent section 202, a transport channel 203, an extraction section 204, a reagent section 205, a reaction section 206, a waste section 207, a detection section 208, and a preservation section 209. The sample is infused into the transport channel 203 from the sample section 201 while a solvent is also infused into the transport channel 203 from the solvent section 202. The sample is dissolved in the solvent, and then a chemical substance aimed is extracted at the extraction section 204. Then the chemical substance and a reagent that is infused from the reagent section 205 react at the reaction section 206. An unnecessary substance is separated after the reaction into the waste section 207. The substance aimed is quantitatively detected at the detection section 208, and then preserved in the preservation section 209.

The sample section 201, the solvent section 202, the transport channel 203, the extraction section 204, the reagent section 205, the reaction section 206, the waste section 207, the detection section 208, and the preservation section 209 are included in the chemical reaction section 102. Each section has each appropriate temperature except for the section independent from the temperature.

For example, 40° C. (Celsius) is appropriate for the reaction section 206 to enhance the reaction efficiency. 20° C. is optimal for the detection section 208 to facilitate the detection of the substance. 4° C. is appropriate for the waste section 207 and the preservation section 209 to store the waste and the substance stably. As described above, the microchemical chip 101 includes the chemical reaction section 102 in which various chemical processes are carried out at each of the appropriate temperature, and the chemical reaction section 102 includes the sample section 201, the solvent section 202, the transport channel 203, the extraction section 204, the reagent section 205, the reaction section 206, the waste section 207, the detection section 208, and the preservation section 209.

Figure 3:
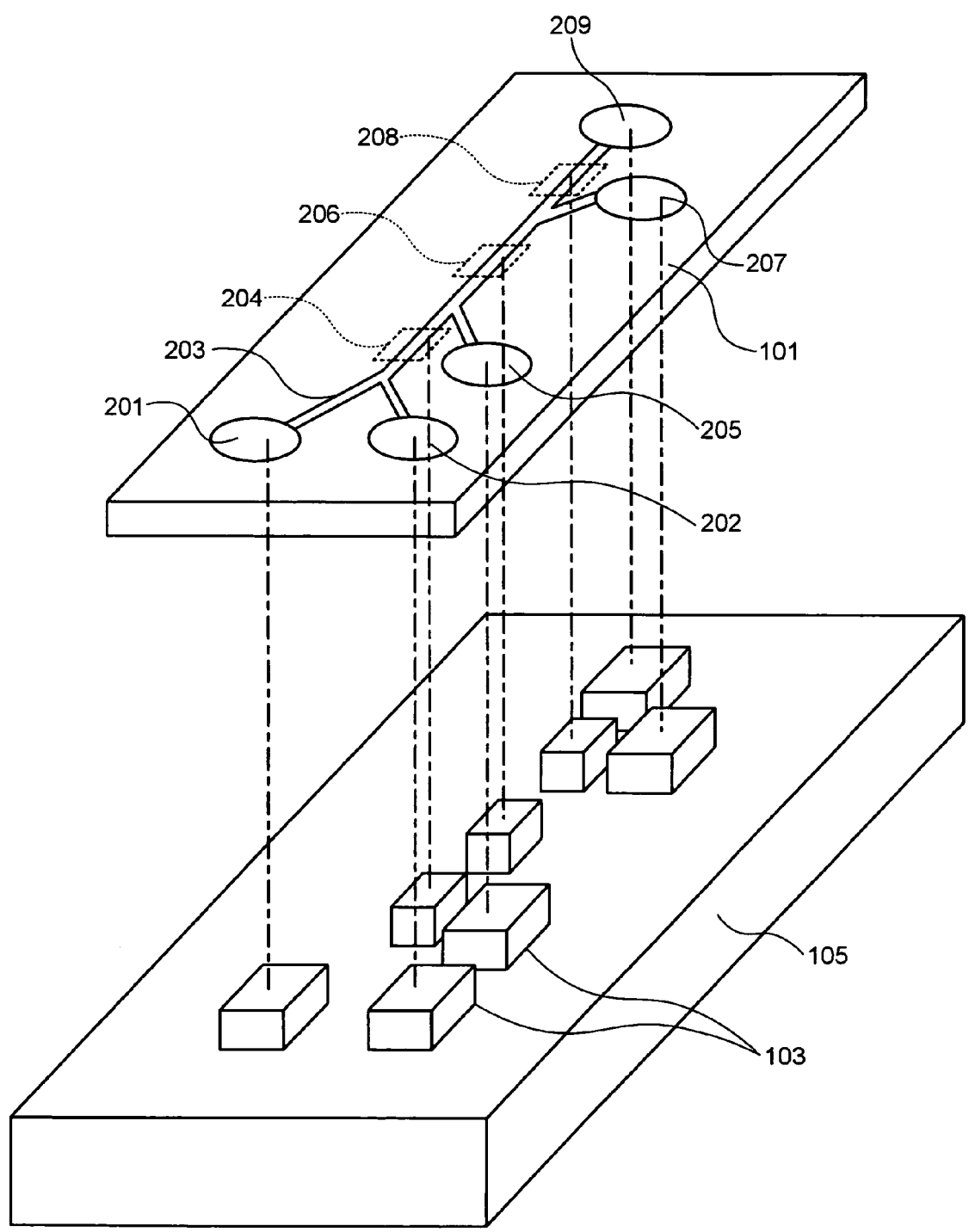
FIG. 3 is a diagram that explains an arrangement of a thermoelectric element.

FIG. 3 is a diagram that explains an arrangement of the thermoelectric element. As described above, more than one of the chemical reaction section 102, which is sufficiently smaller than the microchemical chip 101, are locally arranged in the microchemical chip 101. When the temperature at each of the chemical reaction sections 102 is controlled independently to adjust to a different temperature appropriate for each, the thermoelectric element 103 is prepared one each for each of the chemical reaction sections 102, and arranged on the heat exchanging unit 105 at each portion that corresponds to each of the chemical reaction sections 102 as shown in FIG. 3.

The temperature measuring unit 402 is also prepared one each for each of the chemical reaction sections 102, and arranged near each of the chemical reaction sections 102. The temperature controlling unit 506 independently controls the current to be applied to the thermoelectric elements 103 based on the temperature measured by each of the temperature measuring units 402. Such the structure realizes optimal chemical processes with the microchemical chip 101. The heat conductor 104, the connecting layer 106, the heat-conductive connecting layer 107, the elastic body 108, the movable member 109, the support 110, and the supporting member 111 are omitted in FIG. 3.

Figure 4:
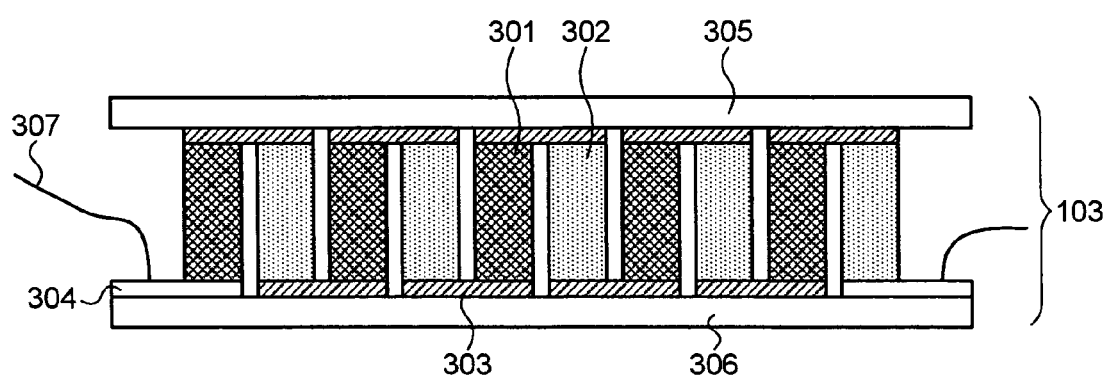
FIG. 4 is a cross-section of an example of the thermoelectric element.

An example of the thermoelectric element 103 is explained next. FIG. 4 is a cross-section of an example of the thermoelectric element. In the thermoelectric element 103 shown in FIG. 4, a p-type thermoelectric semiconductor 301 and an n-type thermoelectric semiconductor 302 are alternately aligned. Each of the p-type thermoelectric semiconductors 301 is connected to the n-type thermoelectric semiconductor 302, which is adjacent, through a wiring electrode 303. Each of the n-type thermoelectric semiconductors 302 is connected to the p-type thermoelectric semiconductors 301, which is adjacent, through the wiring electrode 303. In other words, more than one of the p-type thermoelectric semiconductor 301 and more than one of the n-type thermoelectric semiconductor 302 are electrically connected in series in alternate order.

Each of the p-type thermoelectric semiconductor 301 and the n-type thermoelectric semiconductor 302 that are placed at ends of a series connected unit, which is composed of the p-type thermoelectric semiconductors 301 and the n-type thermoelectric semiconductors 302, is connected to a lead electrode 304. The lead electrode 304 is connected to a lead 307. The series connected unit is sandwiched between heat conductive boards 305 and 306. The wiring electrode 303 and the lead electrode 304 are connected to the heat conductive boards 305 and 306.

One of the heat conductive boards 305 and 306 becomes a hot junction and the other one becomes a cold junction. Both of the heat conductive boards 305 and 306 can be the hot junction or the cold junction. Which one of the heat conductive boards 305 and 306 becomes which of the junctions is determined by the direction of the current flown in the series connected unit.

Joule's heat is generated by the current that flows in the thermoelectric element 103. When the heat conductive board 305 functions as the cold junction and cools an object that touches it, heat absorbed at the cold junction and the Joule's heat are conducted to the heat conductive board 306 that is situated on the other side. Therefore, the heat accumulates in the thermoelectric element 103 on the side of the heat conductive board 306 unless a structure to dissipate the heat is prepared. As a result, the temperature of the thermoelectric element 103 rises, and the temperature on the side of the cold junction also rises.

When the heat conductive board 305 is the hot junction and heats an object that touches the heat conductive board 305, the heat conductive board 306 on the other side becomes the cold junction. The temperature of the thermoelectric element 103 falls unless a structure to give, to the thermoelectric element 103, the heat necessary to keep the temperature is prepared. As a result, the temperature at the heat conductive board 305 also falls.

Therefore, to control the temperature by cooling or heating one of the ends of the thermoelectric element 103, it is indispensable to prepare a function, such as a heat sink, that realizes sufficient heat exchange at the other end of the of the thermoelectric element 103. For this purpose, in this embodiment, the heat exchanging unit 105 is connected to the thermoelectric element 103 through the connecting layer 106 (see FIG. 1). The heat exchanging unit 105 is explained later.

The heat conductive boards 305 and 306 are formed with heat conductive ceramics such as aluminum nitride and alumina. The p-type thermoelectric semiconductor 301 is formed, for example, with an alloy that includes BiTeSb. The n-type thermoelectric semiconductor 302 is formed, for example, with an alloy that includes BiTeSe. However, a thermoelectric material is not to be limited to the materials above, and various kinds of materials that include other types of alloys in the BiTe family may be used depending on a use.

Under such the condition that the heat exchange is properly achieved with the heat exchanging unit 105, the surface of the thermoelectric element 103 can be kept at a constant temperature within a range from minus several tens of degrees Celsius to plus one hundred and several tens of degrees Celsius by changing the direction of the current that flows in the thermoelectric element 103, or by adjusting the current. It is also possible to change the temperature speedily enough to some extent. Moreover, the temperature on the surface near the chemical reaction section 102 can be precisely controlled with a maximum error of about 0.1° C. Therefore, the temperature at the chemical reaction section 102 can be controlled with sufficiently high precision.

The thermoelectric element 103 may have other structures than the structure shown in FIG. 4. The thermoelectric element 103 may be structured without one or both of the heat conductive boards 305 and 306 by filling a resin between the p-type thermoelectric semiconductor 301 and the n-type thermoelectric semiconductor 302. If the heat conductive boards 305 and 306 are not arranged, an insulation layer should be arranged, for example, between the wiring electrode 303 and the heat conductor 104, or between the wiring electrode 303 and the heat exchanging unit 105. Furthermore, if more than one of the thermoelectric element 103 that is arranged in layers is used to function as one unit of the thermoelectric element, the range of the adjustable temperature becomes even larger, and the precision of the temperature adjustment also improves.

The thermoelectric element 103 in the embodiment is several millimeters (mm) cubic, for example, 1 mm to 3 mm cubic. To manufacture such the small thermoelectric element 103, a manufacturing method in the U.S. Pat. No. 3,225,049 vested in the applicant of this application can be applied. In other words, with the manufacturing method in the U.S. Pat. No. 3,225,049, it is possible to obtain the thermoelectric element 103 of the size of 1 mm to 3 mm cubic. With the thermoelectric element 103 thus manufactured, it becomes possible to locally heat or cool the chemical reaction section 102 in the microchemical chip 101. Thus, the temperature of the microchemical chip 101 can be regulated locally.

Figure 5:
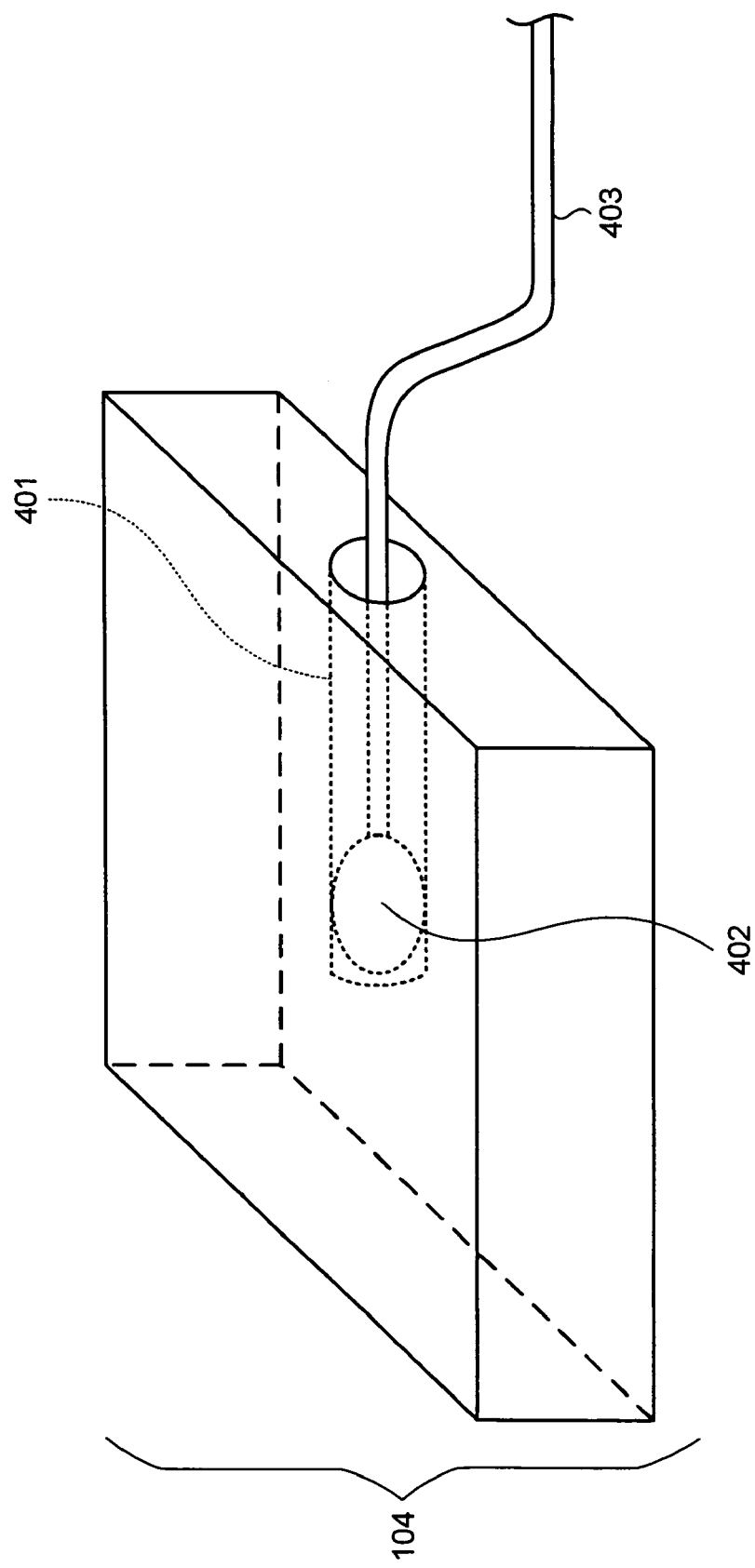
FIG. 5 is a perspective view of an example of a heat conductor.

An example of the heat conductor 104 and the temperature measuring unit 402 is explained next. FIG. 5 is a perspective view of an example of the heat conductor. As shown in FIG. 5, the temperature measuring unit 402 is integrated with the heat conductor 104. The heat conductor 104 includes a hole 401. The temperature measuring unit 402 is arranged inside the hole 401.

A lead 403 of the temperature measuring unit 402 comes out from the hole 401. The hole 401 is closed with a filling such as a heat conductive adhesive. Thus, the temperature measuring unit 402 is fixed to the heat conductor 104. Since the temperature measuring unit 402 is embedded inside the heat conductor 104, the temperature measuring unit 402 can be place near the chemical reaction section 102. Therefore, it is possible to measure the temperature at the chemical reaction section 102 precisely. As the temperature measuring unit 402, a temperature sensor, such as a thermistor, a platinum thermo resistance (Pt 100 Ω), and a thermocouple, is used.

The temperature measuring unit 402 may not be integrated with the heat conductor 104. The temperature measuring unit 402 may be arranged on a surface near the chemical reaction section 102, for example, on a surface of the microchemical chip 101 on the opposite side at which the heat conductor 104 is arranged. The temperature measuring unit 402 may also be arranged inside the microchemical chip 101.

Any structure in which the temperature measuring unit 402 can measure the temperature at the chemical reaction section 102 may be applied. Therefore, the temperature measuring unit 402 may be arranged without a contact with the microchemical chip 101, if a radiation thermometer that achieves non-contact temperature measurement is used as the temperature measuring unit 402.

The heat conductor 104 may not be arranged. The heat conductive board 305 or 306 arranged at the thermoelectric element 103 may be given the function of the heat conductor 104 in this structure. The temperature measuring unit 402 may be integrated with the heat conductive board 305 or 306, or may be independent from the heat conductive board 305 or 306.

FIG. 6 is a block diagram of an exemplary configuration of the temperature controlling unit 506. As shown in FIG. 6, the temperature controlling unit 506 includes a temperature converting circuit 501, a current controlling circuit 502, a power source circuit 503 that includes a plug 504, and a console 505.

The temperature measuring unit 402 is connected to the temperature converting circuit 501 through the lead 403. The temperature converting circuit 501 receives an electric signal that is output from the temperature measuring unit 402 based on the temperature measured, and converts the signal into temperature information. The current controlling circuit 502 is connected to the temperature converting circuit 501. The current controlling circuit 502 controls the direction and the amount of the current to be applied to the thermoelectric element 103 by executing a feedback control based on the temperature measured by the temperature measuring unit 402 to adjust the temperature to a target temperature that is set in advance. The feedback control includes PID control that is common for the temperature adjustment. Thus, the temperature can be adjusted to the target temperature with the error less than 0.1° C.

The power source circuit 503 transforms a utility power voltage that is supplied through the plug 504 to a desirable direct current voltage. The power source circuit 503 supplies the direct current voltage to the current controlling circuit 502. The console 505 is connected to the current controlling circuit 502. The console 505 includes a display unit and a switch for various settings. The display unit displays a real-time temperature, which is the temperature measured by the temperature measuring unit 402, and the target temperature.

Figure 7:
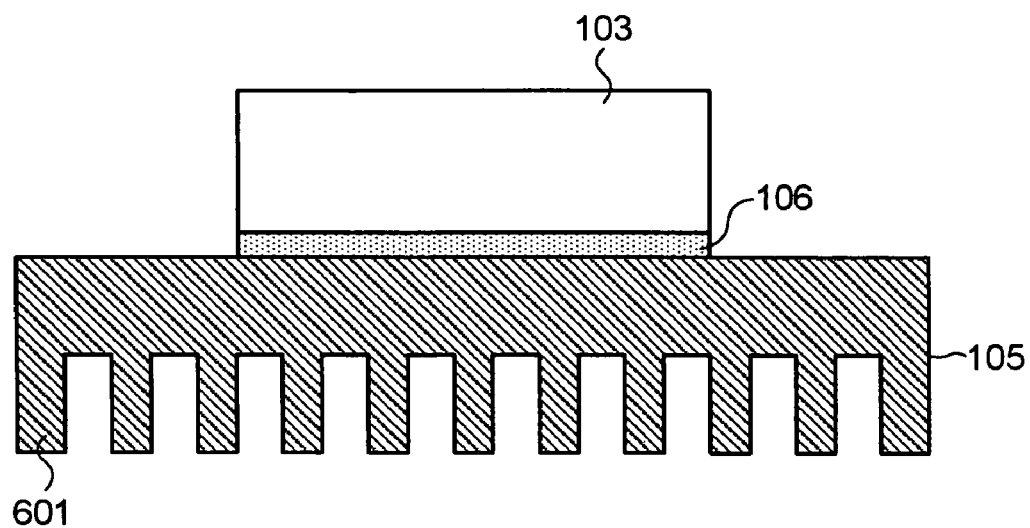
FIG. 7 is a cross-section of an example of a heat exchanging unit.

An example of the heat exchanging unit 105 is explained next. FIG. 7 is a cross-section of an example of the heat exchanging unit 105. The heat exchanging unit 105 shown in FIG. 7 is a heat sink that includes a fin 601. The heat exchanging unit 105 exchanges heat with air around the heat exchanging unit 105 through the fin 601. A fan that forces the heat exchange may be included besides the fin 601. This type of the heat exchanging unit 105 is simple and compact, and is applicable when a range of the temperature to be adjusted is not too wide.

Figure 8:
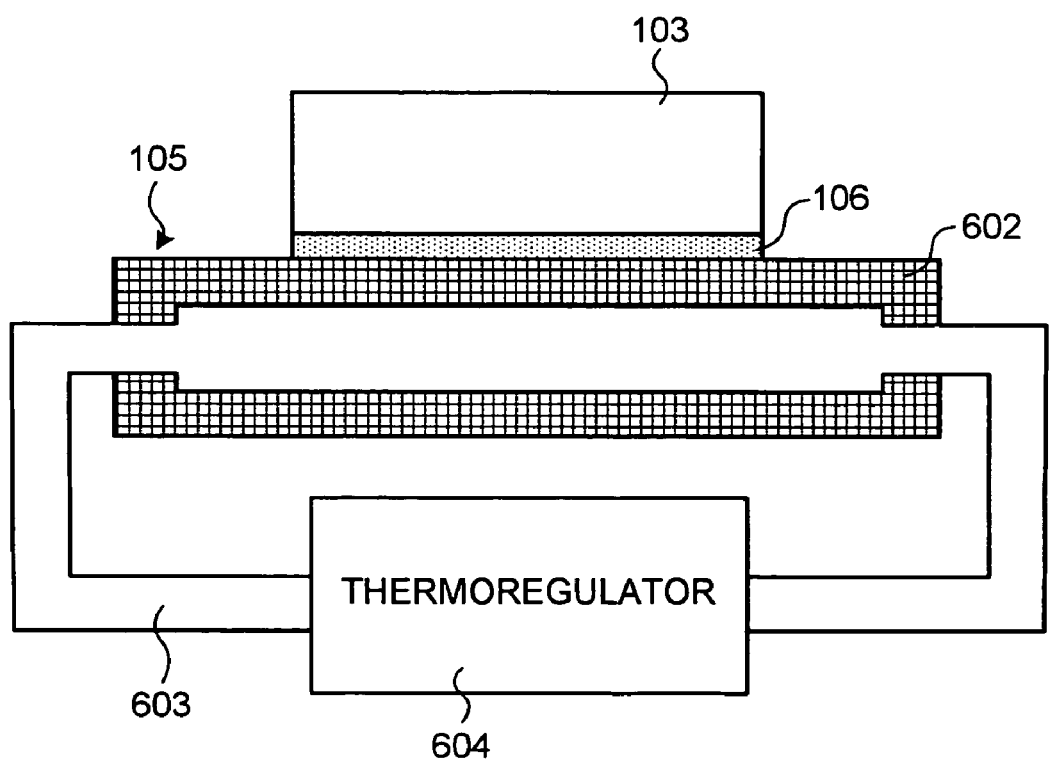
FIG. 8 is a cross-section of another example of the heat exchanging unit.

FIG. 8 is a cross-section of another example of the heat exchanging unit 105. The heat exchanging unit 105 shown in FIG. 8 includes a liquid bath 602 that is connected to a thermoregulator 604 through a pipe 603. The heat exchange is achieved with liquid that flows inside the liquid bath 602. This type of the heat exchanging unit 105 is suitable when the range of the temperature to be adjusted is wide, especially when it is required to cool down to minus several tens of degrees Celsius.

As described previously, according to the first embodiment, the microchemical chip 101 and the heat conductor 104 to which the thermoelectric element 103 is heat-conductively connected are heat-conductively connected to each other by applying the pressure to the heat-conductive connecting layer 107 with the pressure applying unit. Such the structure realizes the low thermal resistance between the thermoelectric element 103 and the chemical reaction section 102 at which the temperature should be controlled. Therefore, it becomes possible to locally control the temperature at the chemical reaction section 102 with high precision by heating or cooling.

Moreover, according to the first embodiment, the heat exchanging unit 105 is heat-conductively connected to the thermoelectric element 103. This enables efficient heat exchange between the thermoelectric element 103 and the heat exchanging unit 105. Therefore, performance in adjusting the temperature at the chemical reaction section 102 improves. Furthermore, the heat loss around the thermoelectric element 103 becomes low. Therefore, power consumption of the thermoelectric element 103 can be reduced.

Furthermore, according to the first embodiment, when more than one of the chemical reaction section 102 that is sufficiently small is arranged locally in the microchemical chip 101 as shown in FIG. 3, it is possible to independently control the temperature at each of the chemical reaction sections 102. The inventors of the present invention actually made a sample with the thermoelectric element 103 as small as 3 mm×3 mm. The sample includes more than one laminated unit that includes the thermoelectric element 103 to which the heat conductor 104 of a size of 5 mm×6 mm is connected through the connecting layer 106. The laminated units are connected to the heat exchanging unit 105 keeping a regular distance of 1 mm from each other through the connecting layer 106. The microchemical chip 101 is connected to the laminated units through the heat-conductive connecting layer 107.

The inventors tested the temperature adjustment with the sample at a room temperature by setting one of the laminated units for 15° C. and an adjacent one of the laminated units for 60° C. It was possible to adjust both the laminated units to the target temperatures without each affecting the other.

The result of the test indicates that if the microchemical chip 101 is 5 centimeters (cm)×7 cm, about 80 chemical reaction sections 102 at the maximum can be arranged in one microchemical chip 101. Furthermore, if the thermoelectric element 103 of a size of 1 mm×1 mm is used, from several hundreds to a thousand of the chemical reaction sections 102 can be arranged in one microchemical chip 101 of the size of 5 cm×7 cm.

Figure 9:
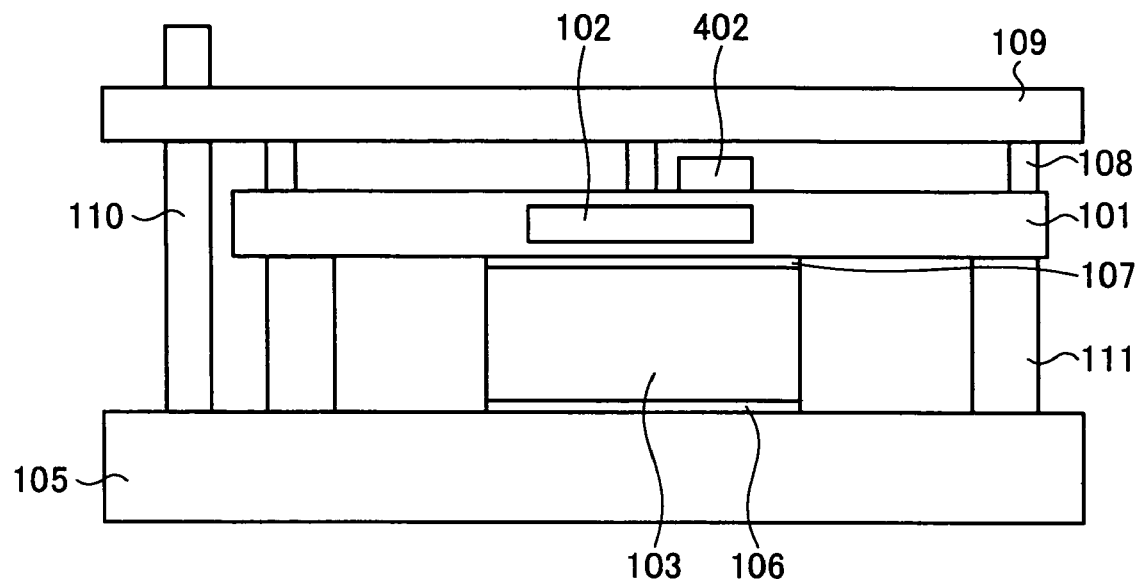
FIG. 9 is a side view of a temperature regulator according to a second embodiment of the present invention.

FIG. 9 is a side view of a temperature regulator according to a second embodiment of the present invention. The temperature regulator shown in FIG. 9 has a structure in which the thermoelectric element 103 is connected to the microchemical chip 101 at a surface near the chemical reaction section through the heat-conductive connecting layer 107. In other words, the thermoelectric element 103 is directly connected to the microchemical chip 101 without the heat conductor 104, which is included the temperature regulator of the first embodiment. The temperature measuring unit 402 is arranged near the chemical reaction section 102, for example, on an upper surface of the microchemical chip 101 as shown in FIG. 9 with a heat conductive adhesive. The temperature controlling unit 506 in the second embodiment is same as the temperature controlling unit 506 in the first embodiment (also same in other embodiments).

According to the second embodiment, the thermal resistance between the microchemical chip 101 and the thermoelectric element 103 becomes lower because the heat conductor 104 is not arranged between. The heat loss also becomes low. Therefore, a precision in adjusting the temperature at the chemical reaction section 102 further improves. In addition, the temperature regulator becomes compact.

Figure 10:
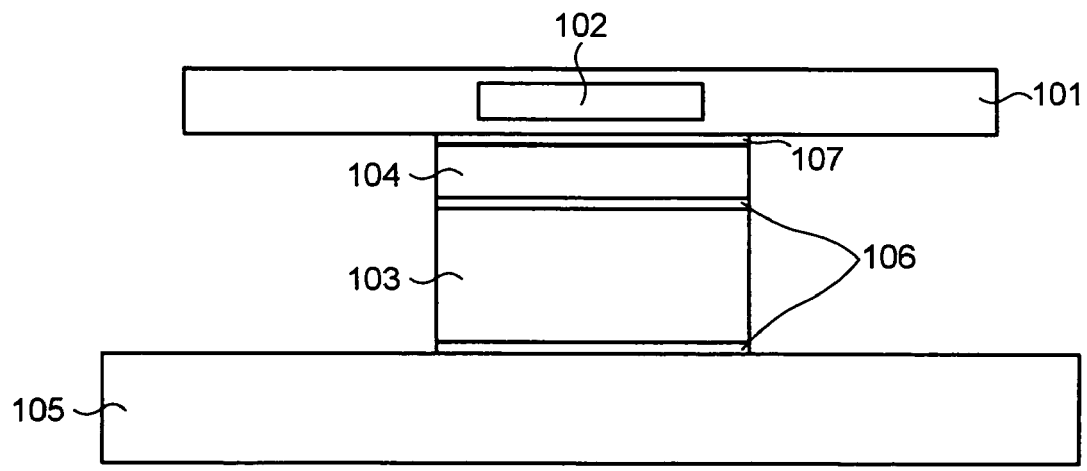
FIG. 10 is a side view of a temperature regulator according to a third embodiment of the present invention.

FIG. 10 is a side view of a temperature regulator according to a third embodiment of the present invention. In the temperature regulator according to the third embodiment, the heat conductor 104 is fixed to the microchemical chip 101 with solder or a heat conductive adhesive as the heat-conductive connecting layer 107. The thermal resistance between the heat conductor 104 and the microchemical chip 101 in this structure becomes low. Therefore, it is not necessary to apply pressure to the heat-conductive connecting layer 107 with a weight to obtain the low thermal resistance. For this reason, the temperature regulator shown in FIG. 10 does not include the pressure applying unit that includes the elastic body 108, the movable member 109, the support 110, and the supporting member 111. The temperature measuring unit 402 in the third embodiment is the same as the temperature measuring unit 402 in the first embodiment and the second embodiment (also same in the other embodiments).

According to the third embodiment, the microchemical chip 101, the heat conductor 104, the thermoelectric element 103, and the heat exchanging unit 105 are integrated. This realizes an easy handling of the temperature regulator. The temperature regulator of this embodiment is handy, and is suitable for a disposable use or a use in a repetition of exactly the same chemical processes.

Figure 11:
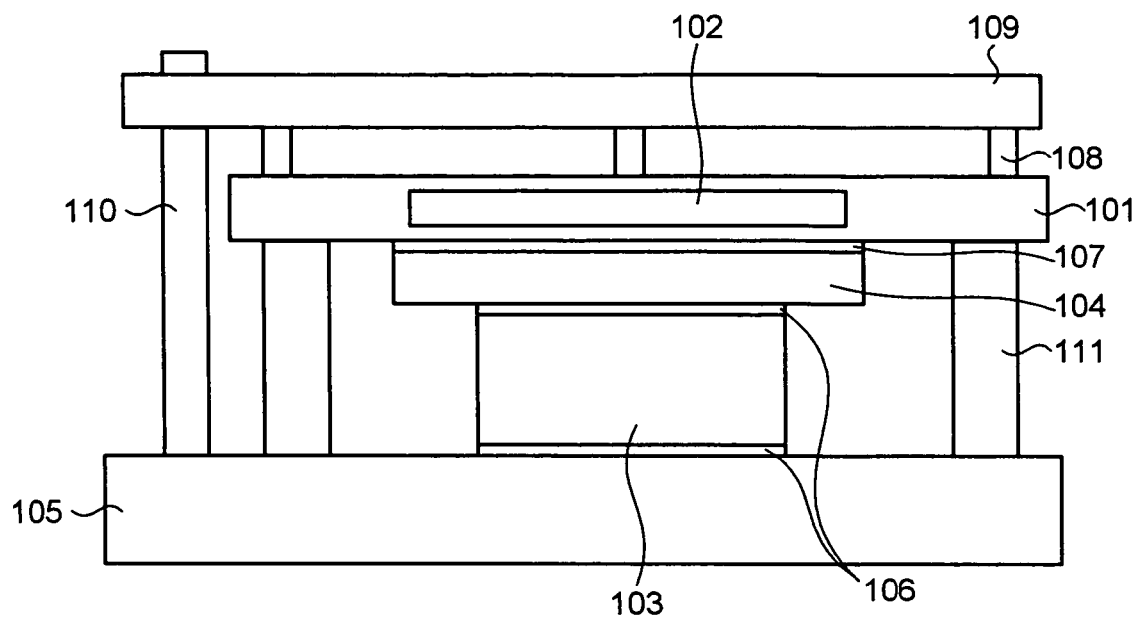
FIG. 11 is a side view of a temperature regulator according to a fourth embodiment of the present invention.

FIG. 11 is a side view of a temperature regulator according to a fourth embodiment of the present invention. As shown in FIG. 11, the surface area of the heat conductor 104 to which the microchemical chip 101 is heat-conductively connected through the heat-conductive connecting layer 107 is larger than the surface area of the thermoelectric element 103 to which the heat conductor 104 is connected.

According to the fourth embodiment, temperature in an area larger than a surface area of the thermoelectric element 103 can be controlled. Therefore, the temperature regulator becomes applicable to a case in which the chemical reaction section 102 is larger in area than the thermoelectric element 103. The temperature regulator becomes flexible in design.

Figure 12:
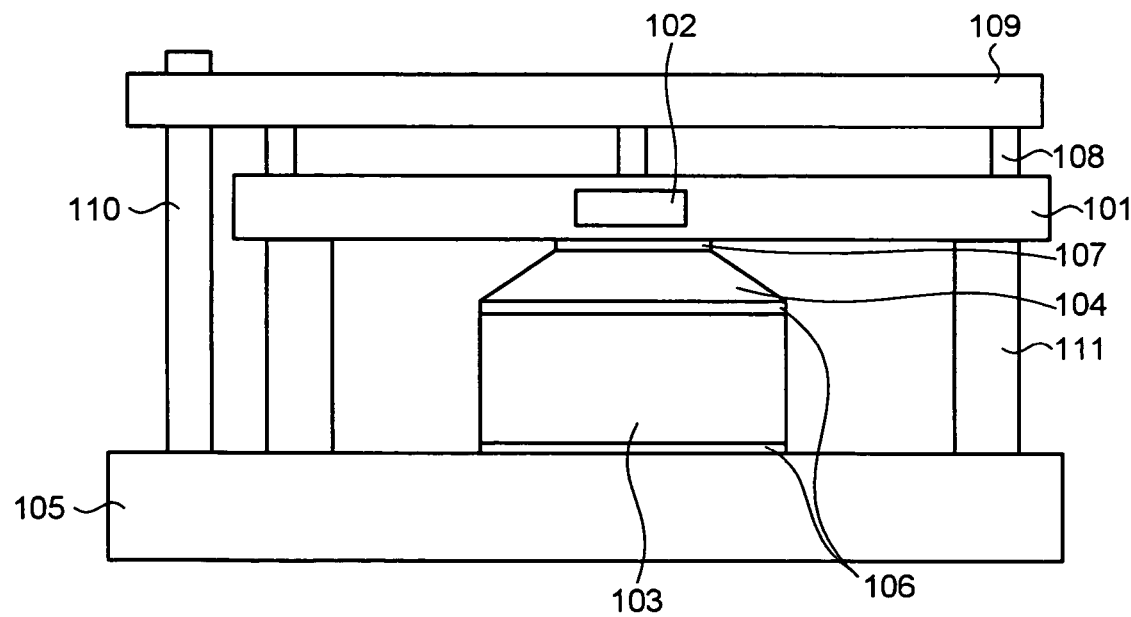
FIG. 12 is a side view of a temperature regulator according to a fifth embodiment of the present invention.

FIG. 12 is a side view of a temperature regulator according to a fifth embodiment of the present invention. As shown in FIG. 12, the heat conductor 104 has a shape of a truncated pyramid that gradually become narrow toward the microchemical chip 101. The surface area of the heat conductor 104 to which the microchemical chip 101 is heat-conductively connected through the heat-conductive connecting layer 107 is smaller than the surface area of the thermoelectric element 103.

According to fifth embodiment, temperature in an area smaller than a surface area of the thermoelectric element 103 can be controlled. Therefore, the temperature regulator becomes applicable to a case in which the chemical reaction section 102 is smaller than the thermoelectric element 103. The temperature regulator becomes flexible in design. Moreover, it becomes possible to control the temperature at the chemical reaction section 102 that is extremely small.

Figure 13:
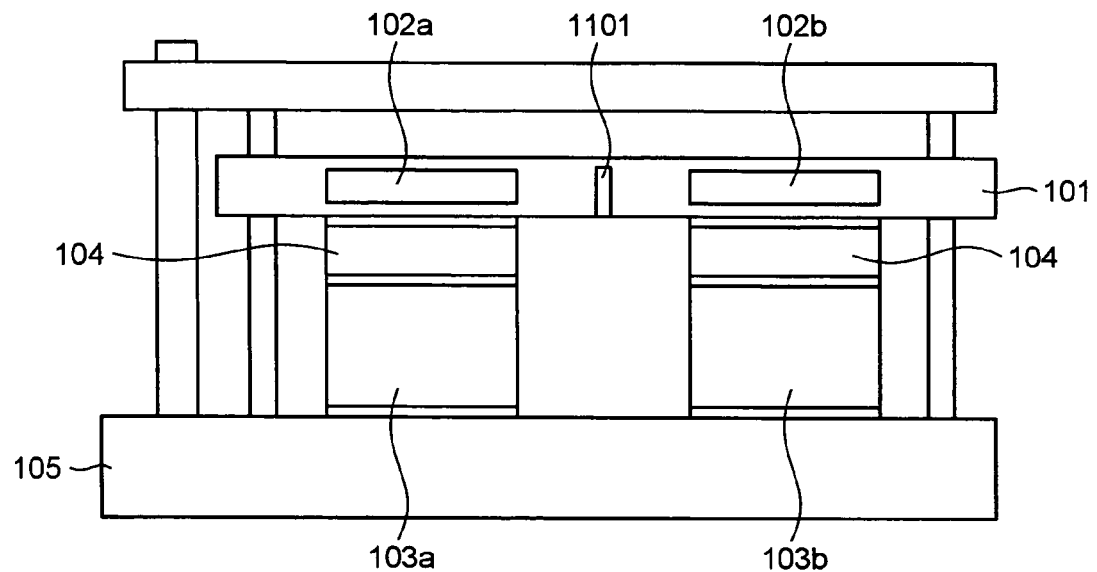
FIG. 13 is a side view of a temperature regulator according to a sixth embodiment of the present invention.

FIG. 13 is a side view of a temperature regulator according to a sixth embodiment of the present invention. As shown in FIG. 13, the temperature regulator according to the sixth embodiment includes a heat insulation layer 1101 between two chemical reaction sections 102a and 102b that are arranged closely next to each other in the microchemical chip 101. A temperature at each of the chemical reaction sections 102a and 102b is independently controlled by each of thermoelectric elements 103a and 103b.

The heat insulation layer 1101 may be formed with a gap in which air or a heat insulating material such as resin is filled. The heat insulation layer 1101 may be formed with an evacuated hollow closed inside the microchemical chip 101. The heat insulation layer 1101 according to this embodiment is also applicable to the temperature regulator that includes three or more chemical reaction sections and thermoelectric elements.

According to the sixth embodiment, interference with each other between the temperatures of both the chemical reaction sections 102a and 102b that are arranged closely to each other can be reduced. Therefore, it is possible to control the temperature at each of the chemical reaction sections 102a and 102b independently with high precision. In other words, various chemical processes can be carried out in the chemical reaction sections 102a and 102b that are arranged in a single piece of the microchemical chip 101 at an optimal temperature for each of the chemical processes. Therefore, it is possible to improve accuracy of the chemical process, or to speed up the reaction. Thus, the performance of the microchemical chip 101 improves.

Figure 14:
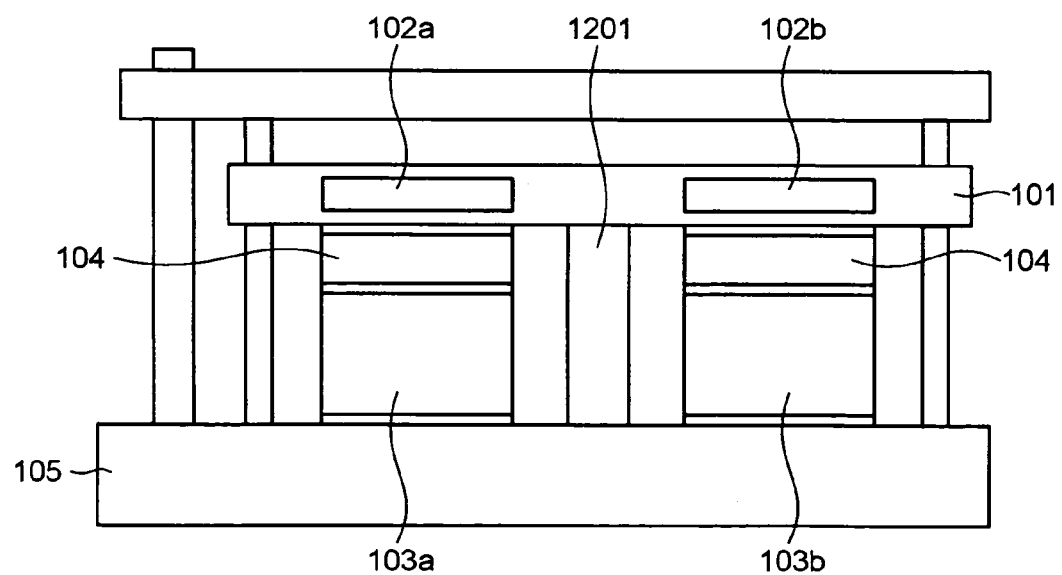
FIG. 14 is a side view of a temperature regulator according to a seventh embodiment of the present invention.

FIG. 14 is a side view of a temperature regulator according to a seventh embodiment of the present invention. As shown in FIG. 14, the temperature regulator according to the seventh embodiment includes a heat conductive connector 1201 between two of the chemical reaction sections 102a and 102b that are arranged closely next to each other in the microchemical chip 101. A temperature at each of the chemical reaction sections 102a and 102b is independently controlled by each of the thermoelectric elements 103a and 103b. The heat conductive connector 1201 is formed with a heat conductive material, and is arranged parallel to the thermoelectric elements 103a and 103b. The heat conductive connector 1201 is heat-conductively connected to the microchemical chip 101 and the heat exchanging unit 105. The heat conductive connector 1201 according to this embodiment is also applicable to the temperature regulator that includes three or more chemical reaction sections and thermoelectric elements.

According to the seventh embodiment, each of the heat that are conducted from each of the chemical reaction sections 102a and 102b is transferred through the heat conductive connector 1201 to the heat exchanging unit 105. Therefore, interference with each other between the temperatures of both the chemical reaction sections 102a and 102b can be reduced. It is possible to control the temperature at each of the chemical reaction sections 102a and 102b independently with high precision. In other words, various chemical processes can be carried out in the chemical reaction sections 102a and 102b that are arranged in a single piece of the microchemical chip 101 at an optimal temperature for each of the chemical processes. Therefore, it is possible to improve accuracy of the chemical process, or to speed up the reaction. Thus, the performance of the microchemical chip 101 improves.

Both the structures in the sixth embodiment and the seventh embodiment may be applied together in one of the temperature regulator. Such the structure enables to further reduce the interference with each other between the chemical reaction sections 102a and 102b. Therefore, it is possible to control the temperature at each of the chemical reaction sections 102a and 102b independently with higher precision.

Figure 15:
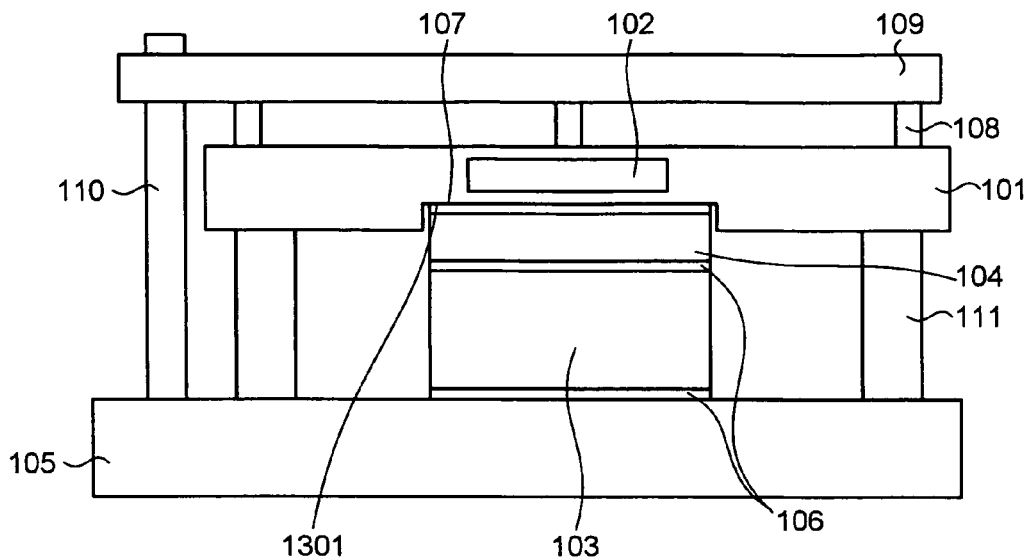
FIG. 15 is a side view of a temperature regulator according to an eighth embodiment of the present invention.

FIG. 15 is a side view of a temperature regulator according to an eighth embodiment of the present invention. As shown in FIG. 15, the temperature regulator according to the eighth embodiment includes a concave section 1301 that is arranged in the microchemical chip 101 on a surface near the chemical reaction section 102. The heat conductor 104 is fit inside the concave section 1301, and is connected to the microchemical chip 101 through the heat-conductive connecting layer 107. The thermoelectric element 103 and the microchemical chip 101 may be connected with each other only through the heat-conductive connecting layer 107 without the heat conductor 104.

According to the eighth embodiment, because a part of the heat conductor 104 is placed inside the concave section 1301, the thermoelectric element 103, which is connected to the heat conductor 104, can be placed closer to the chemical reaction section 102. Therefore, the thermal resistance between the chemical reaction section 102 and thermoelectric element 103 becomes lower, and the heat loss also becomes low. Thus, the performance of the temperature regulator to adjust the temperature at the chemical reaction section 102 further improves. In addition, the power consumption of the thermoelectric element 103 can be reduced. Furthermore, the concave section 1301 realizes easy positioning for the heat conductor 104 to be connected to the microchemical chip 101. Therefore, workability for assembly of the temperature regulator also improves.

Figure 16:
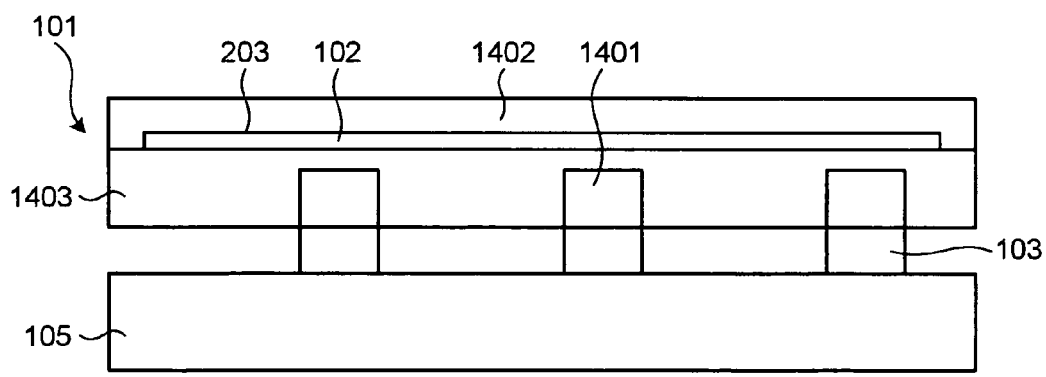
FIG. 16 is a side view of a temperature regulator according to a ninth embodiment of the present invention.
Figure 17:
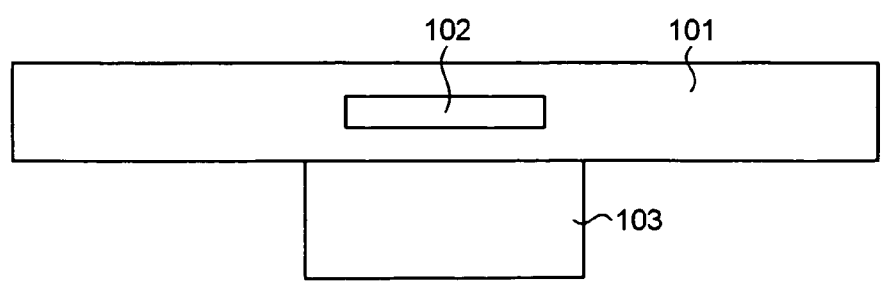
FIG. 17 is a side view of a conventional temperature regulator.

FIG. 16 is a side view of a temperature regulator according to a ninth embodiment of the present invention. As shown in FIG. 16, the temperature regulator according to the ninth embodiment includes a heat conductive member 1401 that is embedded in the microchemical chip 101 at a portion that corresponds to the chemical reaction section 102. The heat conductive member is formed with a material that is more heat conductive than a material for the microchemical chip 101. The thermoelectric element 103 is heat-conductively connected and fixed to the heat conductive member 1401 through the connecting layer 106. Such the structure is effective if a portion to which the thermoelectric element 103 is connected in the microchemical chip 101 is formed with a low heat conductive material, such as resin.

The microchemical chip 101 according to the ninth embodiment includes a base 1402 that is formed with a material, such as glass, silicon, or resin, and a resin board 1403 that is formed with resin. The base and the resin board are intimately connected to each other. A gap is arranged in the base 1402. When the resin board closes the gap, the gap forms the transport channel 203 through which a chemical substance is passed.

The chemical reaction section 102 is arranged on the transport channel 203. The heat conductive member 1401 is embedded in the resin board 1403 right under the chemical reaction section 102 as shown in FIG. 16. Thus, the heat conductive member 1401 is integrated with the resin board 1403. The thermoelectric element 103 is heat-conductively connected and fixed to the heat exchanging unit 105 through the connecting layer 106.

The microchemical chip 101 that integrates with the heat conductive member 1401 is manufactured, for example, as follows. The heat conductive member 1401 that is made of metal or ceramics is placed on a workbench at a position that corresponds to the chemical reaction section 102. A board material, such as of silicon resin, of acrylic resin, or of polycarbonate resin, is softened by heating.

Then, the board material, which is softened, is pressed to the heat conductive member 1401 on the workbench. Thus, the heat conductive member 1401 is embedded in the board material. When the board material becomes cold and solid, the heat conductive member 1401 and the board material are integrated. Thus, the resin board 1403 is completed. The microchemical chip 101 is obtained by integrating the resin board 1403 and the base 1402 by gluing or by thermocompressing.

The resin board 1403 may also be manufactured as follows. The heat conductive member 1401 is placed on a workbench. A low molecular solvent is applied on the heat conductive member 1401, and is kept in a desirable thickness. Then, the solvent is polymerized by heating or by applying ultraviolet rays. Thus, the resin board 1403 is formed.

According to the ninth embodiment, even if the heat conductivity of the resin board 1403 is low, the heat can be efficiently transferred between the chemical reaction section 102 and the thermoelectric element 103 through the heat conductive member 1401. While in the resin board 1403, the heat is difficult-to be conducted. Therefore, it becomes possible to locally control the temperature more effectively achieved. In other words, the interference with each other between the temperatures of two of the chemical reaction sections 102, which are closely arranged to each other inside the microchemical chip 101, can be reduced. Therefore, it is possible to control the temperature at each of the chemical reaction sections 102 independently with high precision.

The present invention is not to be limited to the embodiments described above, and is possible to be modified for various variations. For example, if the heat conductor 104 or the thermoelectric element 103 can be connected to the microchemical chip 101 with sufficient heat conductivity, the heat-conductive connecting layer 107 may be omitted. Moreover, a thermoelectric element in general also functions as a thermoelectric generator. Temperature differentials may be created using an exothermic reaction and an endothermic reaction in the microchemical chip 101. The thermoelectric element 103 can generate electricity with the temperature differentials without modifying the structure of the temperature regulator. The electricity can be used for the microchemical chip 101.

As described above, the temperature regulator according to the embodiment includes the microchemical chip 101 in which the chemical reaction section 102 is arranged, the temperature measuring unit 402 that is arranged near the chemical reaction section 102, and that measures temperature at the chemical reaction section 102, the thermoelectric element 103 of which a surface is heat-conductively connected to the microchemical chip 101 on a surface near the chemical reaction section 102, the heat exchanging unit 105 that is connected and fixed to another surface of the thermoelectric element 103, the temperature controlling unit 506 that controls the electric current that is applied to the thermoelectric element 103 based on the temperature measured by the temperature measuring unit 402.

Because the microchemical chip 101 and the thermoelectric element 103 are heat-conductively connected to each other, the thermal resistance between the thermoelectric element 103 and the chemical reaction section 102 at which the temperature should be controlled becomes low. Thus, the heat loss becomes low, and the performance in adjusting the temperature at the chemical reaction section 102 improves. Moreover, because the heat exchanging unit 105 is heat-conductively connected to the thermoelectric element 103, heat exchange is effectively carried out between the thermoelectric element 103 and the heat exchanging unit 105. Therefore, the performance in adjusting the temperature at the chemical reaction section 102 further improves. The temperature at the chemical reaction section 102 is measured by the temperature measuring unit 402, and based on the temperature measured, the temperature controlling unit 506 controls the electric current that is applied to the thermoelectric element 103 to adjust the temperature to a target temperature. This enables to effectively control the temperature at the chemical reaction section 102 with high precision. Furthermore, because the heat loss around the thermoelectric element 103 is low, the power consumption of the thermoelectric element 103 can be reduced.

Moreover, the temperature regulator according to the embodiment includes the heat-conductive connecting layer 107 to heat-conductively connect the thermoelectric element 103 and the microchemical chip 101 in low thermal resistance. Therefore, the thermal resistance and the heat loss between the thermoelectric. element 103 and the chemical reaction section 102 in the microchemical chip 101 becomes low. Thus, the performance in adjusting the temperature at the chemical reaction section 102 further improves, and the power consumption of the thermoelectric element 103 is further reduced.

Furthermore, the temperature regulator according to the embodiment includes the heat-conductive connecting layer 107 that is formed with a heat conductive grease, a heat conductive sheet, solder, or a heat conductive adhesive. If the heat conductive grease or the heat conductive sheet is used as the heat-conductive connecting layer 107, the microchemical chip 101 becomes removable from the thermoelectric element 103. Therefore, more than one of the microchemical chip 101 can be used for the temperature regulator in various uses, and versatility of the temperature regulator improves. Moreover, if solder or a heat conductive adhesive is used as the heat-conductive connecting layer 107, the temperature regulator becomes handy since the microchemical chip 101, the thermoelectric element 103, and the heat exchanging unit 105 are integrated. In this case, the temperature regulator is suitable for a disposable use or a use in a repetition of exactly the same chemical processes.

Furthermore, the temperature regulator according to the embodiment includes a pressure applying unit that includes the support 110, the movable member 109, and the elastic body 108. With the pressure applying unit, the thermoelectric element 103 is connected to the microchemical chip 101 in lower thermal resistance by applying pressure to the heat-conductive connecting layer 107 with weight on the microchemical chip 101. The thermal resistance and the heat loss between the thermoelectric element 103 and the chemical reaction section in the microchemical chip 101 are further reduced. Therefore, the performance in adjusting the temperature at the chemical reaction section 102 further improves, and the power consumption of the thermoelectric element 103 becomes smaller.

Moreover, the temperature regulator according to the embodiment includes the supporting member 111 that prevents excessive pressure to be applied by the pressure applying unit to the microchemical chip 101. Therefore, it is possible to prevent deformation or damage of the microchemical chip 101 due to strong pressure applied to the microchemical chip 101.

Furthermore, the temperature regulator according to the embodiment includes, in the microchemical chip 101, more than one of the chemical reaction section 102 that is smaller in area than the microchemical chip 101, and each of the chemical reaction sections 102 includes the temperature measuring unit 402 and the thermoelectric element 103 independently. Therefore, it is possible to independently control the temperature of each of the chemical reaction sections 102 to adjust to an optimal temperature for each of the chemical reaction sections 102.

Moreover, the temperature regulator according to the embodiment includes the heat insulation layer 1101 that is filled with air or a heat insulating material, or is evacuated. Because the heat insulation layer is arranged between more than one chemical reaction sections 102a and 102b, interference with each other between the temperatures of the chemical reaction sections 102a and 103a that are to be adjusted to different temperatures can be reduced. Therefore, it is possible to precisely control the temperature for each of the chemical reaction sections 102. In other words, various chemical processes, such as a mix, a reaction, an extraction, a separation, and a condensation, can be carried out in a single piece of the microchemical chip 101 at an optimal temperature for each of the chemical processes. Therefore, it is possible to improve accuracy of the chemical process, or to speed up the reaction. Thus, the performance of the microchemical chip 101 improves.

Furthermore, the temperature regulator according to the embodiment includes the heat conductive connector 1201, between more than one of the chemical reaction sections 102a and 102b. The heat-conductive connector 1201 heat-conductively connects the microchemical chip 101 and the heat exchanging unit 105. Because each of the heat that is conducted from each of the chemical reaction sections 102a and 102b is transferred through the heat conductive connector 1201 to the heat exchanging unit 105, the interference with each other between the temperatures of the chemical reaction sections 102a and 102b can be reduced. Therefore, it is possible to control the temperature at each of the chemical reaction sections 102a and 102b independently with high precision. In other words, various chemical processes, such as a mix, a reaction, an extraction, a separation, and a condensation, can be carried out in a single piece of the microchemical chip 101 at an optimal temperature for each of the chemical processes. Therefore, it is possible to improve accuracy of the chemical process, or to speed up the reaction. Thus, the performance of the microchemical chip 101 improves.

Moreover, the temperature regulator according to the embodiment includes the concave section 1301 in the microchemical chip 101 in which a part of the thermoelectric element 102 fits. Because the thermoelectric element 103 is connected to the microchemical chip 101 inside the concave section 1301 that is arranged near the chemical reaction section 102, the thermoelectric element 103 can be placed closer to the chemical reaction section 102. Therefore, the thermal resistance between the chemical reaction section 102 and thermoelectric element 103 becomes lower, and the heat loss also becomes low. Thus, the performance of the temperature regulator to adjust the temperature at the chemical reaction section 102 further improves. In addition, the power consumption of the thermoelectric element 103 can be reduced. Furthermore, the concave section 1301 realizes easy positioning for the thermoelectric element 103 to be connected to the microchemical chip 101. Therefore, workability for assembly of the temperature regulator also improves.

Furthermore, the temperature regulator according to the embodiment includes the heat conductive member 1401 that is embedded in the microchemical chip 101. Because the heat conductive member 1401 is formed with a material more heat-conductive than the microchemical chip 101, and the thermoelectric element 103 is heat-conductively connected the heat conductive member 1401, the heat can be efficiently transferred between the thermoelectric element 103 and the chemical reaction section 102 near the heat conductive member 1401. If the microchemical chip 101 is formed with a low heat conductive material with such as resin, the temperature can be even more effectively controlled locally because the heat is difficult to be transferred in other area in the microchemical chip 101.

Moreover, the temperature regulator according to the embodiment includes the microchemical chip 101 in which the chemical reaction section 102 is arranged, the temperature measuring unit 402 that is arranged near the chemical reaction section 102, and that measures temperature at the chemical reaction section 102, the heat conductor 104 that is heat-conductively connected to the microchemical chip 101 on an outer surface near the chemical reaction section 102, the thermoelectric element 103 to which the heat conductor 104 is heat-conductively connected, the heat exchanging unit 105 that is connected and fixed to a surface of the thermoelectric element 103, the temperature controlling unit 506 that controls the electric current that is applied to the thermoelectric element 103 based on the temperature measured by the temperature measuring unit 402.

Because the microchemical chip 101 and the heat conductor 104 are heat-conductively connected to each other, and the heat conductor 104 and the thermoelectric element 103 are heat-conductively connected to each other, the thermal resistance between the thermoelectric element 103 and the chemical reaction section 102 at which the temperature should be controlled becomes low. Thus, the heat loss also becomes low, and the performance in adjusting the temperature at the chemical reaction section 102 improves. Moreover, because the heat exchanging unit 105 is heat-conductively connected to the thermoelectric element 103, the heat exchange is effectively carried out between the thermoelectric element 103 and the heat exchanging unit 105. Therefore, the performance in adjusting the temperature at the chemical reaction section 102 further improves. Moreover, the temperature at the chemical reaction section 102 is measured by the temperature measuring unit 402, and based on the temperature measured, the temperature controlling unit 506 controls the electric current that is applied to the thermoelectric element 103 to adjust the temperature to a target temperature. Therefore, it is possible to precisely control the temperature at the chemical reaction section 102. Furthermore, because the heat loss around the thermoelectric element 103 is low, the power consumption of the thermoelectric element 103 can be reduced.

Furthermore, the temperature regulator according to the embodiment includes the heat-conductive connecting layer 107 to heat-conductively connect the heat conductor 104 and the microchemical chip 101 in low thermal resistance. Therefore, the thermal resistance and the heat loss between the chemical reaction section 102 in the microchemical chip 101 and the thermoelectric element 103 that is connected to the heat conductor 104 becomes low. Thus, the performance in adjusting the temperature at the chemical reaction section 102 further improves, and the power consumption of the thermoelectric element 103 is further reduced.

Moreover, the temperature regulator according to the embodiment includes the heat-conductive connecting layer 107 that is formed with a heat conductive grease, a heat conductive sheet, solder, or a heat conductive adhesive. If the heat conductive grease of the heat conductive sheet is used as the heat-conductive connecting layer 107, the microchemical chip 101 is removable from the thermoelectric element 103. Therefore, more than one of the microchemical chip 101 can be used for the temperature regulator in various uses, and versatility of the temperature regulator improves. Moreover, if solder or a heat conductive adhesive is used as the heat-conductive connecting layer 107, the temperature regulator becomes handy since the microchemical chip 101, the heat conductor 104, the thermoelectric element 103, and the heat exchanging unit 105 are integrated. In this case, the temperature regulator is suitable for a disposable use or a use in a repetition of exactly the same chemical processes.

Furthermore, the temperature regulator according to the embodiment includes a pressure applying unit that includes the support 110, the movable member 109, and the elastic body 108. With the pressure applying unit, the heat conductor 104 is connected to the microchemical chip 101 in lower thermal resistance by applying pressure to the heat-conductive connecting layer 107 with weight on the microchemical chip 101. The thermal resistance and the heat loss between the chemical reaction section in the microchemical chip 101 and the thermoelectric element 103 that is connected to the heat conductor 104 are further reduced. Therefore, the performance in adjusting the temperature at the chemical reaction section 102 further improves, and the power consumption of the thermoelectric element 103 becomes smaller.

Moreover, the temperature regulator according to the embodiment includes the supporting member 111 that prevents excessive pressure to be applied by the pressure applying unit to the microchemical chip 101. Therefore, it is possible to prevent deformation or damage of the microchemical chip 101 due to strong pressure applied to the microchemical chip 101.

Furthermore, the temperature regulator according to the embodiment includes the heat conductor 104 that has a surface on which the microchemical chip 101 is connected is larger in area than a surface of the thermoelectric element 103 on which the heat conductor 104 is connected. This enables to control the temperature in area larger than the surface area of the thermoelectric element 103. The temperature regulator becomes applicable to a case in which the chemical reaction section 102 is larger in area than the thermoelectric element 103. Therefore, the temperature regulator becomes flexible in design.

Moreover, the temperature regulator according to the embodiment includes the heat conductor 104 that has a surface on which the microchemical chip 101 is connected is smaller in area than a surface of the thermoelectric element 103 on which the heat conductor 104 is connected. Therefore, the temperature in an area smaller than a surface area of the thermoelectric element 103 can be controlled. The temperature regulator becomes applicable to a case in which the chemical reaction section 102 is smaller than the thermoelectric element 103. Therefore, the temperature regulator becomes flexible in design. Moreover, it becomes possible to control the temperature at the chemical reaction section 102 that is extremely small.

Furthermore, the temperature regulator according to the embodiment includes the temperature measuring unit 402 inside the heat conductor 104. Because the temperature measuring unit 402 is arranged inside the heat conductor 104 that is connected to the microchemical chip 101 near the chemical reaction section 102, it is possible to precisely measure the temperature at the chemical reaction section 102 with high precision. Therefore, it becomes possible to control the temperature at the chemical reaction section 102 by controlling the thermoelectric element 103 to adjust to a target temperature.

Furthermore, the temperature regulator according to the embodiment includes, in the microchemical chip 101, more than one of the chemical reaction section 102 that is smaller in area than the microchemical chip 101, and each of the chemical reaction sections 102 includes the temperature measuring unit 402 and the thermoelectric element 103 independently. Therefore, it is possible to independently control the temperature at each of the chemical reaction sections 102 to adjust to an optimal temperature for each of the chemical reaction sections 102 even in the microchemical chip 101 in which more than on e of the chemical reaction section is integrated.

Moreover, the temperature regulator according to the embodiment includes the heat insulation layer 1101 that is filled with air or a heat insulating material, or is evacuated. Because the heat insulation layer is arranged between more than one chemical reaction sections 102a and 102b, interference with each other between the temperatures of the chemical reaction sections 102a and 103a that are to be adjusted to different temperatures can be reduced. Therefore, it is possible to precisely control the temperature for each of the chemical reaction sections 102. In other words, various chemical processes, such as a mix, a reaction, an extraction, a separation, and a condensation, can be carried out in a single piece of the microchemical chip 101 at an optimal temperature for each of the chemical processes. Therefore, it is possible to improve accuracy of the chemical process, or to speed up the reaction. Thus, the performance of the microchemical chip 101 improves.

Furthermore, the temperature regulator according to the embodiment includes the heat conductive connector 1201, between the chemical reaction sections 102a and 102b. The heat conductive connector 1201 heat-conductively connects the microchemical chip 101 and the heat exchanging unit 105. Because each of the heat that is conducted from each of the chemical reaction sections 102a and 102b is transferred through the heat conductive connector 1201 to the heat exchanging unit 105, the interference with each other between the temperatures of the chemical reaction sections 102a and 102b can be reduced. Therefore, it is possible to control the temperature at each of the chemical reaction sections 102a and 102b independently with high precision. In other words, various chemical processes, such as a mix, a reaction, an extraction, a separation, and a condensation, can be carried out in a single piece of the microchemical chip 101 at an optimal temperature for each of the chemical processes. Therefore, it is possible to improve accuracy of the chemical process, or to speed up the reaction. Thus, the performance of the microchemical chip 101 improves.

Moreover, the temperature regulator according to the embodiment includes the concave section 1301 in the microchemical chip 101 in which a part of the heat conductor 104 fits. Because the heat conductor 104 is connected to the microchemical chip 101 inside the concave section 1301 that is arranged near the chemical reaction section 102, the thermoelectric element 103 that is connected to the heat conductor 104 can be placed closer to the chemical reaction section 102. Therefore, the thermal resistance between the chemical reaction section 102 and thermoelectric element 103 becomes lower, and the heat loss also becomes low. Thus, the performance of the temperature regulator to adjust the temperature at the chemical reaction section 102 further improves. In addition, the power consumption of the thermoelectric element 103 can be reduced. Furthermore, the concave section 1301 realizes easy positioning for the heat conductor 104 to be connected to the microchemical chip 101. Therefore, workability for assembly of the temperature regulator also improves.

The temperature regulator according to the present invention is applicable for microchemical chips such as a DNA chip, a chip for protein analysis, a micro TAS, a Lab-on-a-chip, and a microreactor chip. The temperature regulator according to the present invention is especially suitable for a temperature regulator that adjusts temperature at each of chemical reaction sections, which are arranged in a single piece of the microchemical chip, to each different temperature to carry out various chemical processes.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A temperature regulator comprising:
   a microchemical chip;
   a plurality of chemical reaction sections, each of which is embedded in the microchemical chip, wherein a chemical process is carried out in at least one of the chemical reaction sections;
   a plurality of temperature measuring units, each of which measure temperature of a portion of the microchemical chip around a respective one of the chemical reaction sections;
   a plurality of thermoelectric elements, each of which is heat-conductively connected to an outer surface of the microchemical chip near a respective one of the chemical reaction sections perform at least one of heating and cooling of respective one of the chemical reaction sections;
   a heat exchanging unit that is heat-conductively connected to at least one of the thermoelectric elements; and
   a temperature controlling unit that individually controls the thermoelectric elements based on the temperature,
   further comprising a heat-conductive connecting layer through which at least one of the thermoelectric elements is connected to the microchemical chip,
   further comprising a pressure applying unit that applies a pressure to the heat-conductive connecting layer by applying pressure to the microchemical chip, and
   further comprising a supporting member that is arranged on an opposite side of the microchemical chip from the pressure applying unit and supports the microchemical chip so as to prevent at least one of deformation and damage of the microchemical chip when excessive pressure is applied to the microchemical chip by the pressure applying unit,
   wherein the thermo electric element and support member are in contact with the opposite side of the microchemical chip.

2. The temperature regulator according to claim 1, wherein the heat-conductive connecting layer is formed with a material selected from a group consisting of a heat conductive grease, a heat conductive sheet, solder, and a heat conductive adhesive.

3. The temperature regulator according to claim 1, further comprising a heat insulation layer that is arranged between adjacent chemical reaction sections.

4. The temperature regulator according to claim 1, wherein the heat insulation layer is filled with at least one of air and a heat insulating material.

5. The temperature regulator according to claim 1, wherein the heat insulation layer is evacuated.

6. The temperature regulator according to claim 1, wherein each of the thermoelectric elements has a volume of from approximately one to several cubic millimeters.

7. A temperature regulator comprising:
   a microchemical chip;
   a chemical reaction section that is embedded in the microchemical chip, wherein a chemical process is carried out in the chemical reaction section;

a temperature measuring unit that measures temperature of a portion of the microchemical chip around the chemical reaction section;

a thermoelectric element that is heat-conductively connected to an outer surface of the microchemical chip near the chemical reaction section and that is driven in accordance with an electric current so as to perform at least one of heating and cooling of the portion of the microchemical chip around the chemical reaction section;

a heat exchanging unit that is heat-conductively connected to the thermoelectric element; and a temperature controlling unit that controls an electric current applied to the thermoelectric element based on the temperature measured by the temperature measuring unit, wherein the microchemical chip includes a concave section in which a part of the thermoelectric element fits.

8. The temperature regulator according to claim 7, wherein the heat-conductive connecting layer is formed with a material selected from a group consisting of a heat conductive grease, a heat conductive sheet, solder, and a heat conductive adhesive.

9. A temperature regulator comprising:

a microchemical chip;

a chemical reaction section that is embedded in the microchemical chip, wherein a chemical process is carried out in the chemical reaction section;

a temperature measuring unit that measures temperature of a portion of the microchemical chip around the chemical reaction section;

a thermoelectric element that is heat-conductively connected to an outer surface of the microchemical chip near the chemical reaction section and that is driven in accordance with an electric current so as to perform at least one of heating and cooling of the portion of the microchemical chip around the chemical reaction section;

a heat exchanging unit that is heat-conductively connected to the thermoelectric element;

a temperature controlling unit that controls an electric current applied to the thermoelectric element based on the temperature measured by the temperature measuring unit, and a heat conductive member that is more heat conductive than the microchemical chip, and is embedded in the microchemical chip, wherein the thermoelectric element is heat-conductively connected to the heat conductive member.

10. A temperature regulator comprising:

a microchemical chip;

a plurality of chemical reaction sections, each of which is embedded in the microchemical chip, wherein a chemical process is carried out in at least one of the chemical reaction sections;

a plurality of temperature measuring units, each of which measures temperature of a portion of the microchemical chip around a respective one of the chemical reaction sections;

a plurality of heat conductors, each of which is heat-conductively connected to an outer surface of the microchemical chip on or near a respective one of the chemical reaction sections;

a plurality of thermoelectric elements, wherein each surface of the thermoelectric elements is heat-conductively connected to each of the heat conductors, to perform at least one of heating and cooling of a respective one of the chemical reaction sections;

a heat exchanging unit that is heat-conductively connected to another surface of at least one of the thermoelectric elements; and a temperature controlling unit that individually controls the thermoelectric elements based on the temperature, further comprising a heat-conductive connecting layer through which at least one of the heat conductors is connected to the microchemical chip, further comprising a pressure applying unit that applies a pressure to the heat-conductive connecting layer by applying pressure to the microchemical chip, and further comprising a supporting member that is arranged on an opposite side of the microchemical chip from the pressure applying unit and supports the microchemical chip so as to prevent at least one of deformation and damage of the microchemical chip when excessive pressure is applied to the microchemical chip by the pressure applying unit, wherein the thermo electric element and support member are in contact with the opposite side of the microchemical chip.

11. The temperature regulator according to claim 10, wherein the heat-conductive connecting layer is formed with a material selected from a group consisting of a heat conductive grease, a heat conductive sheet, solder, and a heat conductive adhesive.

12. The temperature regulator according to claim 10, wherein the temperature measuring unit is arranged inside the heat conductor.

13. The temperature regulator according to claim 12, wherein the heat insulation layer is evacuated.

14. The temperature regulator according to claim 10, further comprising a heat insulation layer that is arranged between adjacent chemical reaction sections.

15. The temperature regulator according to claim 10, wherein the heat insulation layer is filled with at least one of air and a heat insulating material.

16. The temperature regulator according to claim 10, wherein the heat insulation layer is evacuated.

17. The temperature regulator according to claim 10, wherein each of the thermoelectric elements has a volume of from approximately one to several cubic millimeters.

18. A temperature regulator comprising:

a microchemical chip;

a chemical reaction section that is embedded in the microchemical chip, wherein a chemical process is carried out in the chemical reaction section;

a temperature measuring unit that measures temperature of a portion of the microchemical chip around the chemical reaction section;

a heat conductor that is heat-conductively connected to an outer surface of the microchemical chip on or near the chemical reaction section;

a thermoelectric element, a surface of which is heat-conductively connected to the heat conductor, that is driven in accordance with an electric current so as to perform at least one of heating and cooling of the portion of the microchemical chip around the chemical reaction section;

a heat exchanging unit that is heat-conductively connected to another surface of the thermoelectric element; and a temperature controlling unit that controls electric current applied to the thermoelectric element based on the temperature measured by the temperature measuring unit, wherein a surface area of the heat conductor that is heat-conductively connected to the microchemical chip is smaller than a surface area of the thermoelectric element that is heat-conductively connected to the heat conductor.

19. The temperature regulator according to claim 18, further comprising a heat insulation layer that is arranged between adjacent chemical reaction sections.

20. The temperature regulator according to claim 18, wherein the heat insulation layer is filled with at least one of air and a heat insulating material.

21. A temperature regulator comprising:

a microchemical chip;

a chemical reaction section that is embedded in the microchemical chip, wherein a chemical process is carried out in the chemical reaction section;

a temperature measuring unit that measures temperature of a portion of the microchemical chip around the chemical reaction section;

a heat conductor that is heat-conductively connected to an outer surface of the microchemical chip on or near the chemical reaction section;

a thermoelectric element, a surface of which is heat-conductively connected to the heat conductor, that is driven in accordance with an electric current so as to perform any one of heating and cooling of the portion of the microchemical chip around the chemical reaction section;

a heat exchanging unit that is heat-conductively connected to another surface of the thermoelectric element; and a temperature controlling unit that controls electric current applied to the thermoelectric element based on the temperature measured by the temperature measuring unit, wherein the microchemical chip includes a concave section in which a part of the heat conductor fits.

* * * * *